United States Patent [19]

Darrow

[11] Patent Number: 4,623,850
[45] Date of Patent: Nov. 18, 1986

[54] VITAL CODE GENERATING CIRCUIT
[75] Inventor: John O. G. Darrow, Murrysville, Pa.
[73] Assignee: American Standard Inc., Swissvale, Pa.
[21] Appl. No.: 593,777
[22] Filed: Mar. 27, 1984
[51] Int. Cl.⁴ .................. H03B 27/00; H03L 7/00; H03K 9/06
[52] U.S. Cl. ........................... 331/56; 331/74; 331/111; 328/61; 328/136; 307/528; 307/271; 307/502; 307/274; 307/282; 307/283; 307/301; 307/252 F
[58] Field of Search ........... 307/301, 597, 599, 252 F, 307/274, 275, 289, 282, 283, 502, 525, 526, 593, 518, 529, 595, 271; 328/110, 133, 156, 136, 61; 331/36 L, 111, 113 A, 52, 49

[56] References Cited
U.S. PATENT DOCUMENTS

| | | | |
|---|---|---|---|
| 3,206,684 | 9/1965 | Der et al. | 328/110 |
| 3,909,731 | 9/1975 | Milovancevic | 328/129 |
| 3,956,704 | 5/1976 | Keeney, Jr. et al. | 328/61 |
| 3,965,432 | 6/1976 | Denenberg et al. | 328/61 |

Primary Examiner—Stanley D. Miller
Assistant Examiner—Richard Roseen
Attorney, Agent, or Firm—J. B. Sotak

[57] ABSTRACT

A vital low frequency code generating circuit having a pair of complementary unijunction transistor relaxation oscillators for producing coincidental pulses in the absence of any failure; and a first initially nonconductive transistor amplifier and a second initially conductive transistor amplifier for saturating a square loop core transformer in a positive direction. The coincidental pulses causing the first transistor amplifier to be rendered nonconductive to unsaturate the square loop core transformer and causing the second transistor amplifier to be rendered conductive to saturate the square loop core transformer in the negative direction, which results in the development of output code pulses only when neither of the relaxation oscillators has drifted appreciably.

20 Claims, 2 Drawing Figures

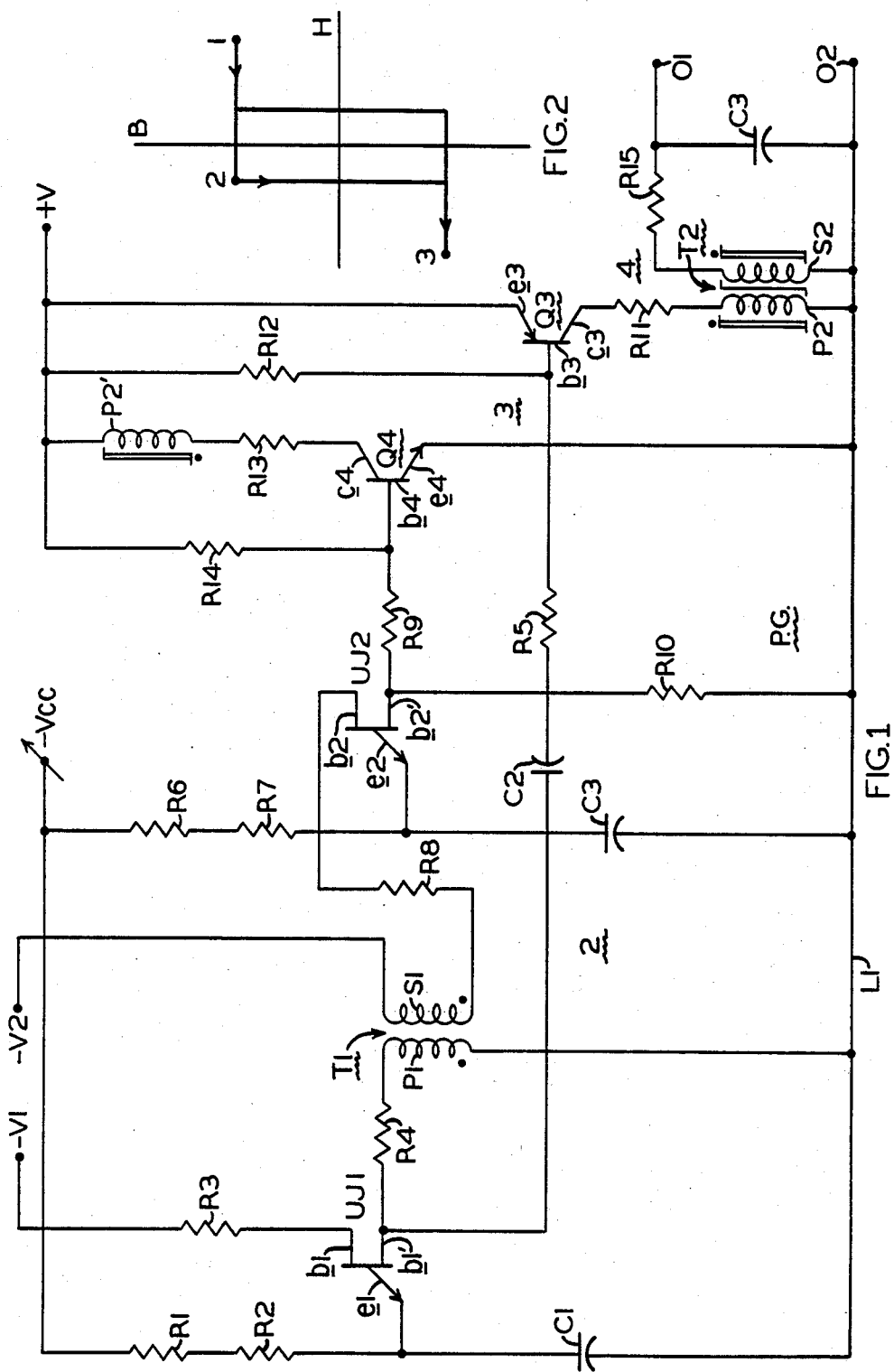

VITAL CODE GENERATING CIRCUIT

FIELD OF THE INVENTION

This invention relates to a vital code generator and, more particularly, to a low frequency signal generating circuit which operates in a safe and stable manner by requiring that the pulses produced by a pair of relaxation oscillators coincide to ensure that a faulty condition is incapable of generating an erroneous output signal.

BACKGROUND OF THE INVENTION

In railroad and mass and/or rapid transit systems, it is common practice to convey the appropriate speed control signals from the wayside to the rails and, in turn, to the lead vehicle via inductive pickup coils. The frequency range of the speed signals normally consists of one (1) to thirty (30) hertz, with the progressively higher frequencies representing and signifying progressively higher speed commands. Accordingly, it is a safety requirement that under no circumstance should a failure result in a higher frequency than the frequency of the last authorized coded signal. Since the frequency range is so low, it is advantageous to generate the coded signals with relaxation oscillators; for example, ones employing unijunction transistors, in order to minimize the size and cost. Normally, in a standard unijunction transistor oscillator, the power is applied across the two base electrodes through several hundred ohm resistors, and to the emitter electrode through a resistor for charging a capacitor. When the voltage of the emitter electrode reaches a certain potential, which is determined internally in a standard unijunction transistor and externally in a programmable unijunction transistor, the unijunction transistor is forward-biased and rendered conductive. The firing of the unijunction transistor causes the capacitor to discharge rapidly, and results in a narrow pulse to be developed across each of the base electrode resistors. The cycle is then repeated, and the pulse rate determines the frequency of the output signals. The output pulses may be used to operate a flip-flop circuit. It will be appreciated that if a defect causes the normal firing voltage of the unijunction transistor to be reduced, or if leakage current flows into the charging capacitor, either from an internal fault within the unijunction transistor or from other sources common to the charging resistor, the frequency of the output pulses is inadvertently and unsafely increased. While this unsafe condition is detectable if the unijunction transistor code generator is checked often enough, but if the checking is in an unsafe direction—in some cases—the increase in the frequency of the coded pulses may go undetected.

OBJECTS AND SUMMARY OF THE INVENTION

Accordingly, it is an object of this invention to provide a vital code generator.

Another object of this invention is to provide a low frequency signal generating circuit which operates in a vital manner.

A further object of this invention is to provide a pulse generator, employing a pair of unijunction transistor relaxation oscillators which must produce coinciding pulses in order to result in an output signal.

Yet another object of this invention is to provide two unijunction transistor relaxation oscillators for generating code pulses whose frequencies are checked by a coincidence circuit.

Yet a further object of this invention is to provide a unique coded pulse generator for producing one of a plurality of low frequencies when the pulses of two unijunction transistor oscillators cause the reverse saturation of a saturable core transformer coincidence circuit.

Still another object of this invention is to provide a vital code generator comprising, first and second relaxation oscillators having a pair of timing circuits for causing the generation of pulses at substantially the same time, and a coincidence circuit for producing an output signal having a frequency corresponding to the pulse rate of the pulses of the relaxation oscillators when the pulses of the relaxation oscillators are in coincidence.

Still a further object of this invention is to provide a code generating circuit which operates in a vital manner comprising, a first unijunction transistor oscillator having an emitter electrode and a first and a second base electrode, a first R-C timing circuit connected to the emitter electrode of the first unijunction transistor oscillator, the first base electrode of the first unijunction transistor oscillator resistively connected to a first supply voltage; a second unijunction transistor oscillator having an emitter electrode and a first and a second base electrode, a second R-C timing circuit connected to the emitter electrode of the second unijunction transistor oscillator, the first base electrode of the second unijunction transistor oscillator resistively connected to a second supply voltage, the second base electrode of the first unijunction transistor oscillator transformer connected to the first base electrode of the second unijunction transistor oscillator and connected to the input of a first transistor amplifier, the second base electrode of the second unijunction transistor oscillator connected to the input of a second transistor amplifier, the outputs of the first and second amplifiers connected to a coincidence circuit which produces an output when and only when the first and second unijunction transistor oscillators produce pulses which are in coincidence.

DESCRIPTION OF THE DRAWINGS

The above objects and other attendant features and advantages of the present invention will be more readily appreciated and better understood by reference to the following detailed description when considered in conjunction with the accompanying drawings, wherein:

FIG. 1 is a schematic circuit diagram of a vital code generating circuit in accordance with the subject invention; and FIG. 2 shows the B-H curve of a rectangular hysteresis loop of a square loop magnetic core of a saturable transformer used in the circuit of FIG. 1.

DETAILED DESCRIPTION OF THE INVENTION

Referring now to the drawings, and in particular to FIG. 1, there is generally shown at PG a circuit for safely generating low frequency code signals which signify speed commands for signalling and controlling the movement of railway vehicles. As shown, the code generating circuit 1 includes an oscillator section 2, an amplifier section 3, and a coincidence section 4.

The oscillator section 2 includes a pair of unijunction transistor relaxation oscillators; namely, a master and a slave oscillator. The first master relaxation oscillator includes a first complementary unijunction transistor UJ1 having an emitter control electrode e1 and a first current-carrying base electrode b1 and a second current-carrying base electrode b1'. An R-C timing circuit, in which the magnitude of a negative supply voltage −VCC determines the pulse rate or frequency of oscillations, includes a to-be-determined (TBD) resistor R1, a fixed resistor R2, and a charging capacitor C1. It will be seen that the TBD resistor R1 and the TBD resistor R6 are selected so that pulse rates or frequencies of the pulses of both of the relaxation oscillators are substantially the same, dependent upon the value of voltage −VCC. The upper end of resistor R1 is connected to a suitable source of negative voltage, such as, the variable power supply −VCC; while the lower end of the timing capacitor C1 is connected to ground reference or common lead L1. The emitter control electrode e1 is connected to the junction between resistor R2 and capacitor C1. The first base electrode b1 is connected by resistor R3 to a suitable source of negative voltage −V1. The second base electrode b1 is connected to common L1 via resistor R4 and primary winding P1 of transformer T1, which will be described in greater detail hereinafter. The second base electrode b1' is also connected to the input of a first transistor amplifier via a coupling capacitor C2 and series resistor R5.

As shown, the second slave relaxation oscillator includes a second complementary unijunction transistor UJ2 having an emitter control electrode e2 and a first current-carrying base electrode b2 and a second current-carrying base electrode b2'. An R-C timing circuit including the TBD resistor R6, a fixed resistor R7, and a charging capacitor C3; determines the frequency of oscillations which is designed to be substantially identical to the pulse rate of the first relaxation oscillator. It will be seen that the first base electrode b2 is connected to resistor R8 and secondary winding S1 of transformer T1 to a separate suitable source of negative voltage −V2. The two base electrode supply voltages −V1 and −V2 are derived from separate, similar d.c. sources, in order to ensure that any single failure is incapable of lowering the potential levels of the base supplies, which would result in the simultaneous increase in the frequencies of the pulses. As shown, the second base electrode b2' is connected to the input of a second transistor amplifier via resistor R9 and is connected to the common lead L1 via resistor R10.

It will be seen that the first output amplifier includes a PNP transistor Q3 having a base electrode b3, a collector electrode c3, and an emitter electrode e3; while the second output amplifier includes an NPN transistor Q4 having a base electrode b4, a collector electrode c4, and an emitter electrode e4.

As shown, the coincidence circuit 4 takes the form of a saturable transformer T2 having a square loop magnetic core, upon which is wound a pair of primary windings P2 and P2' and a secondary winding S2. The upper end of the first primary winding P2 is connected to collector electrode c3 via load resistor R11, while the lower end of primary winding P2 is directly connected to common lead L1. The emitter electrode e3 is directly connected to a suitable source of positive operating voltage +V, while the base electrode b3 is connected to positive voltage source +V via biasing resistor R12. As shown, the upper end of the second primary winding P2' is directly connected to the positive supply voltage +V, while the lower end of primary winding P2' is connected to the collector electrode c4 via load resistor R13. The base electrode b4 is connected by biasing resistor R14 to the positive supply voltage +V, while the emitter electrode e4 is directly connected to the common lead L1.

It will be seen that a current-limiting resistor R15 is connected to the upper end of the secondary winding S2 of output transformer T2, while the lower end of secondary winding S2 is connected to common lead L1. A filter capacitor C3 is connected across output terminals O1 and O2 to remove spurious noise and fluctuations in the output signal.

In describing the operation of the code generating circuit, it will be assumed that the supply voltages are applied to the circuit, and that the components are intact and functioning properly so that the transistor Q4 is forwardly-biased and rendered conductive and the transistor Q3 is held nonconductive. Thus, the current flowing through the primary winding P2' saturates the core of the transformer T2. At the same time, identical charging currents begin to flow through the timing circuits of the two relaxation oscillators. Thus, the voltages across capacitors C1 and C3 begin to build up until the potentials approach voltages at which the unijunction transistors UJ1 and UJ2 are forwardly-biased. In the present instance, the master oscillator is designed to provide approximately ten percent (10%) of its output pulse to the base electrode b2 of the slave oscillator. As shown, the second base electrode b1' is transformer-coupled to the first base electrode b2. The windings of the transformer T1 are arranged such that the polarity will be positive-going pulses, since the capacitor C2 is charging to a negative voltage. The positive voltage on base electrode b2 will cause the unijunction transistor UJ2 to become nearer to its firing point. Thus, if the match between the charging rates of capacitors C1 and C3 is sufficiently close, the small positive voltage on base electrode b2 will result in the unijunction transistor UJ2 firing at substantially the same time that unijunction transistor UJ1 fires, so that an output pulse is developed across terminals O1 and O2. The circuit values, including the resistors R2 and R7, are selected to allow the locking to occur over an approximate ten percent (10%) variation of the time constant of one of the charging circuits. If the two oscillators are locked in, their output pulses will coincide. In order to determine this coincidence of the oscillator pulses, it is necessary to employ the fail-safe limiting locking circuit, which will check against either oscillator drifting more than the allowed amount.

As previously mentioned, the coincidence circuit 4 includes a transformer T2 having a square loop magnetic core, a pair of primary windings P2, P2', and a secondary winding S2. The circuit utilizes the fact that a saturated square loop magnetic core must be moved out of saturation and must have an appropriate number of ampere-turns of the opposite polarity applied thereto, in order to produce an output across the secondary winding S2.

Also as previously mentioned, during the absence of pulses by the oscillators, the amplifying transistor Q3 is nonconductive while the amplifying transistor Q4 is conductive. The conduction of transistor Q4 causes the saturation of transformer T2. Thus, as shown by the B-H curve in FIG. 2, the saturated core of transformer T2 is sitting at point 1 due to the current flow through primary winding P2', which is caused by the conduction of transistor Q4. As noted above, the saturating ampere-turns are applied to the primary windings P2' and P2 by transistors Q4 and Q3, respectively. The output pulses of the two unijunction transistor relaxation oscillators, which are negative-going, are fed to the base electrodes of the transistors Q3 and Q4. As noted above, the transistor Q4 is normally conducting and holding the saturable transformer T2 in a saturated condition. Now, if a negative pulse appears at the base electrode b4, the transistor Q4 turns off and removes the core of transformer T2 from saturated point 1 and moves horizontally to point 2. If, at the same time, another negative-going pulse appears at base electrode b3, the transistor Q3 is turned on and causes the core to be momentarily saturated in the opposite direction to point 3. Thus, an output pulse is developed across the secondary winding S2 during the saturation transition.

It will be appreciated that if these two oscillator pulses do not occur simultaneously, the presence of either one of the pulses can bring the core out of saturation. However, the core will not reverse its flux and cannot saturate in the opposite direction so that there is no appreciable output developed across the secondary winding S2. Thus, it is ensured there will be no output pulse to drive the following circuitry unless the two unijunction transistor oscillators are locked to one another. It will be noted that the two oscillators will not lock to one another unless they would tend to otherwise agree in frequency within a small error. Accordingly, any failure which tends to cause either of the relaxation oscillators to wander appreciably and shift frequencies, will result in the loss of the output and is detectable. Thus, the vitality and safety of the circuit is ensured by the combination of the two unijunction transistor relaxation oscillators, which prevents any failure to cause an unsafe change in the pulse rate. That is, the frequency is incapable of being changed to simulate another recognizable code rate. The output pulse may be fed to a flip-flop circuit to produce a square-wave signal at the desired code frequency.

It will be understood that various alterations and changes may be made by those skilled in the art without departing from the spirit and scope of the subject invention. Therefore, it will be appreciated that certain modifications, ramifications and equivalents will be readily evident to a skilled artisan and, accordingly, it is understood that the present invention is not to be limited to the disclosed environment and the exact embodiment shown and described, but should be afforded the full scope and protection of the appended claims.

Having thus described the invention, what I claim as new and desire to secure by Letters Patent, is:

1. A vital code generator comprising, first and second relaxation oscillators, said first relaxation oscillator having a first timing circuit for causing the generation of pulses of a given frequency of oscillation, said second relaxation oscillator having a second timing circuit for causing the generation of pulses having substantially the same frequency of oscillation as the given frequency of oscillation, and a coincidence circuit connected to said first and second relaxation oscillators for producing an output signal having a frequency of oscillation corresponding to the given frequency of oscillation of the pulses of said first and second relaxation oscillators only when frequencies of oscillation of the pulses of said first and second relaxation oscillators are in coincidence.

2. The vital code generator, as defined in claim 1, wherein each of said first and second relaxation oscillators includes a unijunction transistor.

3. The vital code generator, as defined in claim 1, wherein said coincidence circuit includes a saturable core transformer.

4. The vital code generator, as defined in claim 1, wherein said first and second timing circuits are connected to a variable supply voltage for changing the frequencies of oscillation of the pulses of said first and second relaxation oscillators.

5. The vital code generator, as defined in claim 1, wherein said pulses generated by said first and second relaxation oscillators are fed to respective transistor amplifiers.

6. The vital code generator, as defined in claim 3, wherein said saturable core transormer includes a pair of primary windings and a secondary winding.

7. The vital code generator, as defined in claim 1, wherein said first and second timing circuits are connected to a variable d.c. voltage source for changing the frequencies of oscillation of the pulses of said first and second relaxation oscillators.

8. The vital code generator, as defined in claim 5, wherein one of said transistor amplifiers includes a conducting NPN transistor and another of said transistor amplifiers includes a nonconducting PNP transistor during the absence of said pulses.

9. The vital code generator, as defined in claim 1, wherein each of said timing circuits includes a series R-C network.

10. The vital code generator, as defined in claim 8, wherein one primary winding of a saturable core transformer is connected to a collector electrode of said NPN transistor and another primary winding of said saturable core transformer is connected to a collector electrode of said PNP transistor.

11. The vital code generator, as defined in claim 2, wherein a base electrode of said unijunction transistor of said first relaxation oscillator is transformer-coupled to a base electrode of said unijunction transistor of said second relaxation oscillator to cause a simultaneous firing of said unijunction transistors.

12. The vital code generator, as defined in claim 11, wherein each of said relaxation oscillators includes a transistor having an emitter electrode and a first and a second base electrode.

13. A vital code generating circuit which operates in a vital manner comprising, a first unijunction transistor oscillator having an emitter electrode and a first and a second base electrode, a first R-C timing circuit connected to said emitter electrode of said first unijunction transistor oscillator, said first base electrode of said first unijunction transistor oscillator resistively connected to a first supply voltage, a second unijunction transistor oscillator having an emitter electrode and a first and a second base electrode, a second R-C timing circuit connected to said emitter electrode of said second unijunction transistor oscillator, said first base electrode of said second unijunction transistor oscillator resistively connected to a second supply voltage, said second base electrode of said first unijunction transistor oscillator transformer connected to said first base electrode of said second unijunction transistor oscillator and connected to the input of a first transistor amplifier, said second base electrode of said second unijunction transistor oscillator connected to the input of a second transistor amplifier, and output signals of said first and second amplifiers connected to a coincidence circuit which produces an output when and only when said first and second unijunction transistor oscillators produce pulses which have substantially the same frequency and are in coincidence.

14. The vital code generating circuit, as defined in claim 13, wherein said R-C timing circuits are connected to a variable voltage source for causing a frequency of said pulses produced by said first and second unijunction transistor oscillators.

15. The vital code generating circuit, as defined in claim 13, wherein said first transistor amplifier is nonconducting and said second transistor amplifier is conducting during the absence of said pulses.

16. The vital code generating circuit, as defined in claim 13, wherein said first transistor amplifier is rendered conductive and said second transistor amplifier is rendered nonconductive during the presence of said pulses.

17. The vital code generating circuit, as defined in claim 13, wherein said coincidence circuit includes a saturable core transformer.

18. The vital code generating circuit, as defined in claim 17, wherein said saturable core transformer includes a first primary winding and is connected to the output of said first transistor amplifier, and a second primary winding is connected to the output of said second transistor amplifier.

19. The vital code generating circuit, as defined in claim 17, wherein said saturable core transformer is saturated when said second transistor amplifier is rendered conductive.

20. The vital code generating circuit, as defined in claim 13, wherein each of said R-C timing circuits is connected to a variable d.c. supply voltage for causing a frequency change of said pulses produced by said first and second unijunction transistor oscillators.

* * * * *